(12) United States Patent
Hsu

(10) Patent No.: US 11,744,027 B2
(45) Date of Patent: Aug. 29, 2023

(54) SCREEN ROTATION QUICK RELEASE STRUCTURE

(71) Applicant: Jarllytec Co., Ltd., New Taipei (TW)

(72) Inventor: Yu-Tsun Hsu, New Taipei (TW)

(73) Assignee: JARLLYTEC CO., LTD., New Taipei (TW)

( * ) Notice: Subject to any disclaimer, the term of this patent is extended or adjusted under 35 U.S.C. 154(b) by 218 days.

(21) Appl. No.: 17/375,405

(22) Filed: Jul. 14, 2021

(65) Prior Publication Data
US 2022/0282824 A1  Sep. 8, 2022

(30) Foreign Application Priority Data
Mar. 3, 2021  (TW) .................................. 110107585

(51) Int. Cl.
 *H05K 5/02* (2006.01)
(52) U.S. Cl.
 CPC .................................. *H05K 5/0204* (2013.01)
(58) Field of Classification Search
 CPC .... F16M 11/041; F16M 11/105; F16M 11/24; F16M 2200/08; H05K 5/0204
 See application file for complete search history.

(56) References Cited

U.S. PATENT DOCUMENTS

| 6,443,408 B1* | 9/2002 | Hung ................. | F16M 11/2021 248/176.1 |
| 8,313,074 B2* | 11/2012 | Wang .................. | F16M 11/105 248/295.11 |
| 10,294,984 B2* | 5/2019 | Yonemaru ........... | B60R 11/0229 |
| 10,890,288 B2* | 1/2021 | Gurr ...................... | F16M 11/10 |
| 11,118,722 B2* | 9/2021 | Huang ................. | F16M 11/041 |
| 11,396,970 B2* | 7/2022 | Huang ................. | F16B 5/0628 |
| 11,441,724 B2* | 9/2022 | Huang .................. | F16M 11/16 |
| 11,519,548 B2* | 12/2022 | Hsu ...................... | F16M 11/041 |
| 11,538,442 B2* | 12/2022 | Gurr ..................... | G06F 1/1601 |

(Continued)

FOREIGN PATENT DOCUMENTS

| CN | 101881365 A | 11/2010 | |
| WO | WO-2019154227 A1 * | 8/2019 | ............. B60K 35/00 |

OTHER PUBLICATIONS

Translation of WO-2019154227-A1 (Year: 2019).*

*Primary Examiner* — Abhishek M Rathod
*Assistant Examiner* — Keith DePew
(74) *Attorney, Agent, or Firm* — Muncy, Geissler, Olds & Lowe, P.C.

(57) ABSTRACT

The present invention is a screen rotation quick release structure. One end of an adapter member is connected to a support frame. One end of a positioning pin protrudes from the other end of the adapter member, and the positioning pin is positioned inside the adapter member in a reciprocating way. A hinge module comprises a first pivoting shaft and a second pivoting shaft. A gap between proximal ends of the first and the second pivoting shafts is provided for accommodating the one end of the positioning pin. A first buckling ring is accommodated and positionally constrained in a clamping space of a top base. An inner ring surface of the first buckling ring has a first and a second engaging grooves. The first and the second engaging grooves are respectively corresponding to distal ends of the first and the second pivoting shafts.

13 Claims, 12 Drawing Sheets

(56) References Cited

U.S. PATENT DOCUMENTS

| | | | |
|---|---|---|---|
| 2007/0064379 A1* | 3/2007 | Shin | F16M 11/2064 |
| | | | 361/679.06 |
| 2007/0064380 A1* | 3/2007 | Shin | F16M 11/24 |
| | | | 248/917 |
| 2018/0032104 A1* | 2/2018 | Schatz | G06F 1/1683 |
| 2019/0327841 A1* | 10/2019 | Li | F16M 11/105 |
| 2019/0357368 A1* | 11/2019 | Huang | F16M 11/105 |
| 2020/0158278 A1* | 5/2020 | Daugirdas | A61B 6/4405 |
| 2021/0164606 A1* | 6/2021 | Cheng | F16M 11/28 |

* cited by examiner

SCREEN ROTATION QUICK RELEASE STRUCTURE

FIELD OF THE INVENTION

The present invention is related to a screen rotation quick release structure, especially one that allows the stand and the screen to be quickly assembled and disassembled, and the screen can be turned safely.

BACKGROUND OF THE INVENTION

All-in-one computers are mainly built in the mainframe on the screen, and then the back of the screen is combined with the top of a stand through the locked structure, so that the stand supports the screen and is used on a desktop or on a flat surface. This way of being connected to the screen and the stand through the locked structure is not very convenient in assembly and disassembly, and it takes a lot of time. Therefore, as shown in the "Screen Quick Release Structure" of the People's Republic of China Invention Patent Application No. 202010626128.4, it provides a feasible solution. Its stand comprises a top base. The top base is connected to one side of the top of a support frame. The top base has a front and a rear covering bodies relatively covering each other. A clamping space is formed between the front and the rear covering bodies. An outer periphery of the front covering body has a plurality of notches. One side of the rear covering body has a first position-constraining hole. A first buckling ring is positionally constrained in the clamping space in a manner of capable of restoring position after being rotated. A pushed portion of the first buckling ring passes through the first position-constraining hole for pushing and pressing the first buckling ring to rotate. A second buckling ring is connected to a rear side surface of a screen. The second buckling ring has a plurality of second buckling portions respectively inserted into the plurality of notches of the front covering body and correspondingly buckled to a plurality of the first buckling portions of the first buckling ring for easy and fast assembly or disassembly of the stand and the screen.

As shown in the patent invention of the People's Republic of China Granted Patent Application No. CN101881365, it provides a "support frame that enables the screen rotation and height adjustment to be interlocked". It is applied to a screen that can be rotated to be horizontally or vertically. It is mainly used to control whether the screen can be rotated to a vertical state by a specific height of the screen, and at the same time, whether the height is adjustable by rotating the screen to be horizontal or vertical, so that the screen rotation and height adjustment can be interlocked. In this way, when the screen is in a vertical state, the screen cannot be raised in height, and when the height of the screen is raised, the screen cannot be turned into a vertical state, so that the vertical screen can only be kept in the lowest position.

SUMMARY OF THE INVENTION

With the structure of the "Screen Quick Release Structure" China Patent Application No. 202010626128.4, it is indeed possible to quickly complete the assembly of the coupling frame and the screen, but the position of the screen to be disassembled and assembled is not limited to the specific height of the support frame, and when the screen is rotated, the screen can also be disassembled. As a result, during the screen is rotated, not only it is easy to cause damage to the bottom base or desk when the screen is turned from horizontal to vertical, but also impossible to confirm that the coupling frame is in a horizontal or vertical position after the screen is disassembled, which is not conducive to reassemble. Furthermore, during the rotation of the screen, if the user accidentally touches the pushed portion of the first buckling ring, the screen may be separated from the coupling frame and may fall. The structure of the China patent CN101881365, although the screen can be restricted from rotating at a specific height, thereby maintaining the overall stability to avoid tipping. But according to its structure, it cannot completely improve the disadvantage of the structure of the China Patent Application No. 202010626128.4 "Screen Quick Release Structure". In view of this, in order to provide a structure that is different from the conventional technology and improves the above-mentioned disadvantages, the applicants have accumulated many years of experience and made continuous research and development and improvement, so the present invention was invented.

The main purpose of the present invention is to provide a screen rotation quick release structure, which can solve the problem of damage caused by the rotation of the screen; and after the screen is disassembled, the exact position of the coupling frame cannot be confirmed and it is not conducive to reassembly. When the screen is horizontally positioned above one side of the support frame, the screen can be rotated or disassembled at the same time to ensure safe use and convenient assembly.

The second object of the present invention is to provide a screen rotation quick release structure, which can improve the problem that the user accidentally touches the pushed portion during the screen being rotated, so that the screen is separated from the coupling frame and falls. It can be locked when the screen is rotated to prevent users from accidentally touching to ensure safe use.

In order to achieve the objects of the present invention, the present invention provides a screen rotation quick release structure which comprises a stand, a top base, and a first buckling ring. The stand comprises a support frame and an adapter assembly. A positioning groove is provided on an upper portion of one side of the support frame; the adapter assembly comprising an adapter member and a hinge module, one end of the adapter member is connected to the support frame in a manner capable of moving up and down; one end of a positioning pin protrudes from the other end of the adapter member, and the positioning pin is coaxially positioned inside the adapter member in a manner capable of moving back and forth so that the other end of the positioning pin is pressed against and positionally constrained in the positioning groove; one side of the hinge module is connected to the other end of the adapter member, and the hinge module comprises a first pivoting shaft and a second pivoting shaft on the same horizontal line, a gap between proximal ends of the first pivoting shaft and the second pivoting shaft is provided for accommodating the one end of the positioning pin; the top base comprises a clamping space, the hinge module is accommodated and positionally constrained in the clamping space; one side of the top base has a first position-constraining hole, the first position-constraining hole is in communication with the clamping space; the first buckling ring accommodated and positionally constrained in the clamping space in a manner capable of restoring position after being rotated, one side of the first buckling ring has a pushed portion, the pushed portion passes through the first position-constraining hole and protrudes from the one side the top base so as to push and press the first buckling ring to rotate; an inner ring surface of the first buckling ring has a first engaging groove and a second engaging groove, the first engaging groove and the second engaging groove are respectively corresponding to distal ends of the first pivoting shaft and the second pivoting shaft.

In implementation, the top base further comprises a front covering body and a rear covering body relatively covering each other, the clamping space is formed between the front covering body and the rear covering body, the first position-constraining hole is provided on one side of the rear covering body, an outer periphery of the front covering body has a plurality of first notches, the plurality of first notches is in communication with the clamping space.

In implementation, the screen rotation quick release structure further comprises a second buckling ring, the second buckling ring is connected to a rear side surface of a screen, the second buckling ring has a plurality of second buckling portions for being inserted into the plurality of first notches of the front covering body respectively and correspondingly buckled with a plurality of first buckling portions on the other side of the first buckling ring respectively.

In implementation, the one side of the support frame has a guiding groove, the positioning groove is disposed at an upper portion of the guiding groove; one end of the adapter member of the adapter assembly passes through the guiding groove to be connected to the support frame in a manner capable of moving up and down.

In implementation, the adapter member comprises a sleeve, a positioning pillar, and a lifting plate, the positioning pillar is sleeved by the sleeve, one end of the positioning pillar is connected to the hinge module, the other end of the positioning pillar has an engaging groove for being engaged with the lifting plate, the engaging groove is in communication with a through hole for the one end of the positioning pin protruding outwards; one end of the lifting plate passes through the guiding groove, and a plate surface of the other end of the lifting plate has a horizontal position-constraining groove for positioning the positioning pin capable of moving back and forth, so that the other end of the positioning pin is pressed against the guiding groove or positionally constrained in the positioning groove.

In implementation, the one end of the positioning pin passes through a spring so that the positioning pin is capable of moving back and forth; the horizontal position-constraining groove of the other end of the lifting plate is T-shaped, and the other end of the positioning pin has a head portion for being positioned in the horizontal position-constraining groove.

In implementation, the adapter assembly further comprises a stopping ring, an outer periphery of the stopping ring has a first stopping portion and a second stopping portion; the top base further comprises a linking member, the linking member is clamped and connected between the front covering body and the rear covering body, an inner periphery of the linking member has a pressed-against portion for being pressed against the first stopping portion or the second stopping portion respectively, so that the screen is positioned in vertical or horizontal position, after the linking member being rotated synchronously with the top base and the screen.

In implementation, the hinge module further comprises a connecting assembly, the connecting assembly comprises a fixed plate set and a position-constraining plate set, the fixed plate set is coaxially pivoted to the first pivoting shaft and the second pivoting shaft, the stopping ring is clamped and connected with the fixed plate set and the position-constraining plate set, and the linking member is clamped between the fixed plate set and the position-constraining plate set in a rotatable manner.

In implementation, the top base further comprises a linking member, an outer periphery of the linking member has a positioning assembly, the positioning assembly has a positioning member capable of radially moving back and forth; the hinge module further comprises a connecting assembly, the connecting assembly comprises a fixed plate set and a position-constraining plate set, the fixed plate set is coaxially pivoted to the first pivoting shaft and the second pivoting shaft, the linking member is clamped between the fixed plate set and the position-constraining plate set in a rotatable manner; the position-constraining plate set comprises a position-constraining plate, an outer periphery of the position-constraining plate has a first position-constraining portion and a second position-constraining portion for being engaged with the positioning member, after the linking member being rotated.

In implementation, the outer periphery of the linking member has a second notch, the positioning assembly further comprises a first elastic member and a pair of clamping pieces, one end of the first elastic member is pressed against the positioning member; the pair of clamping pieces is positioned in the second notch, and two ends of the pair of clamping pieces are connected to the linking member respectively, a positioning space is arranged between the pair of clamping pieces for positioning the first elastic member and the positioning member, so that the positioning member is capable of radially moving back and forth.

In implementation, the positioning member further comprises a guiding rod, the guiding rod penetrates outwards through the one side of the pair of clamping pieces; the one side of the first buckling ring has a receiving groove for accommodating and positionally constraining a second elastic member and a pressed-against member, one end of the pressed-against member is pressed against the second elastic member, the other end of the pressed-against member is pressed against the guiding rod for constraining movement of the guiding rod.

In implementation, the first buckling ring comprises an annular buckling plate and a plurality of third elastic members, the annular buckling plate has a plurality of third position-constraining portions arranged in a circular array for positionally constraining one end of the plurality of third elastic members respectively, one side of the front covering body has a plurality of fourth position-constraining portions for positionally constraining the other end of the plurality of third elastic members respectively.

In implementation, one side of the annular buckling plate has a plurality of first curved grooves arranged in a circular array, one end of each of the first curved grooves forms one corresponding the third position-constraining portion, the one side of the front covering body has a plurality of second curved grooves arranged in a circular array, one end of each of the second curved grooves forms one corresponding the fourth position-constraining portion.

In order to facilitate a more in-depth understanding the present invention, some preferred embodiments referred to drawings are in detail described as follows.

DETAILED DESCRIPTIONS OF PREFERRED EMBODIMENTS

Figure 1:
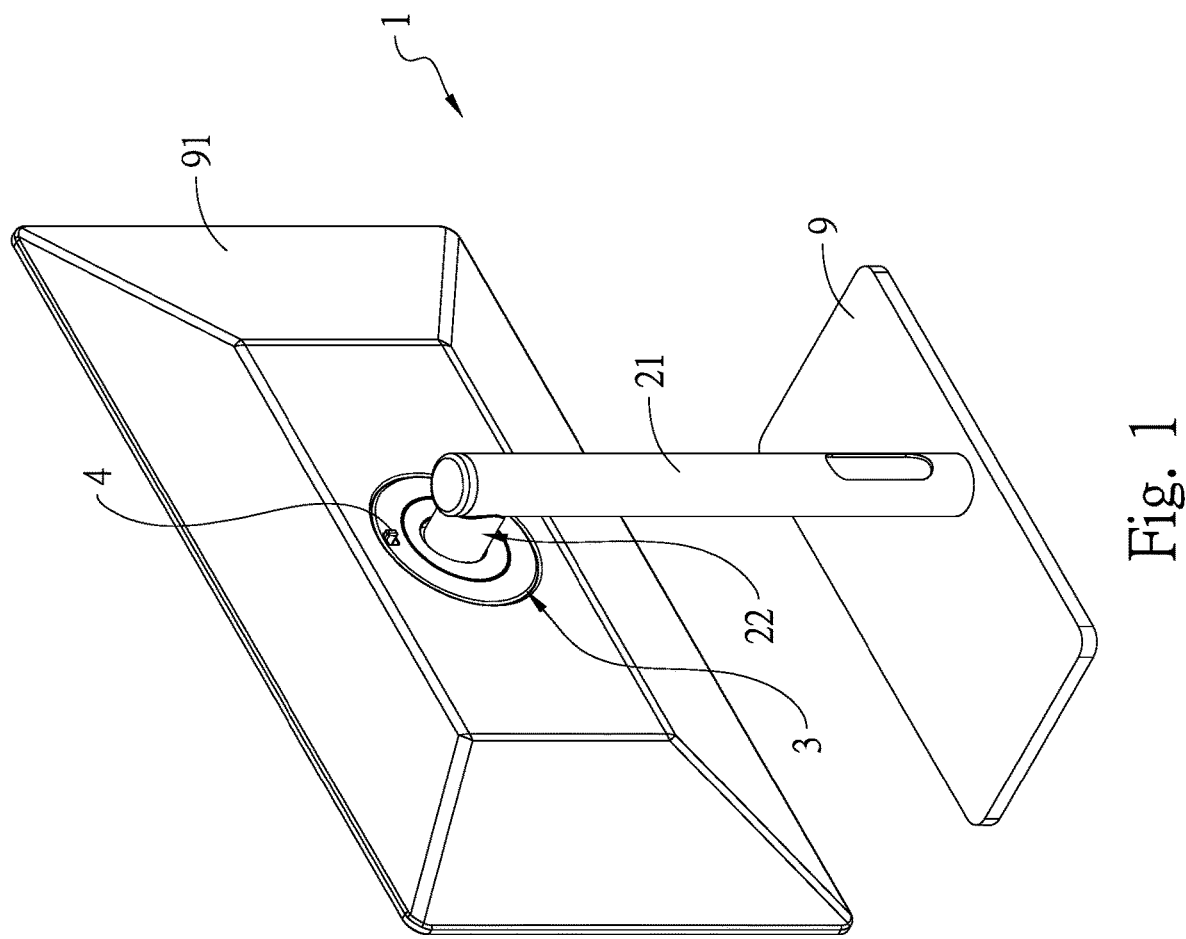
FIG. 1 is a schematic perspective view of a preferred embodiment of the present invention when assembled with screen and bottom base.
Figure 2:
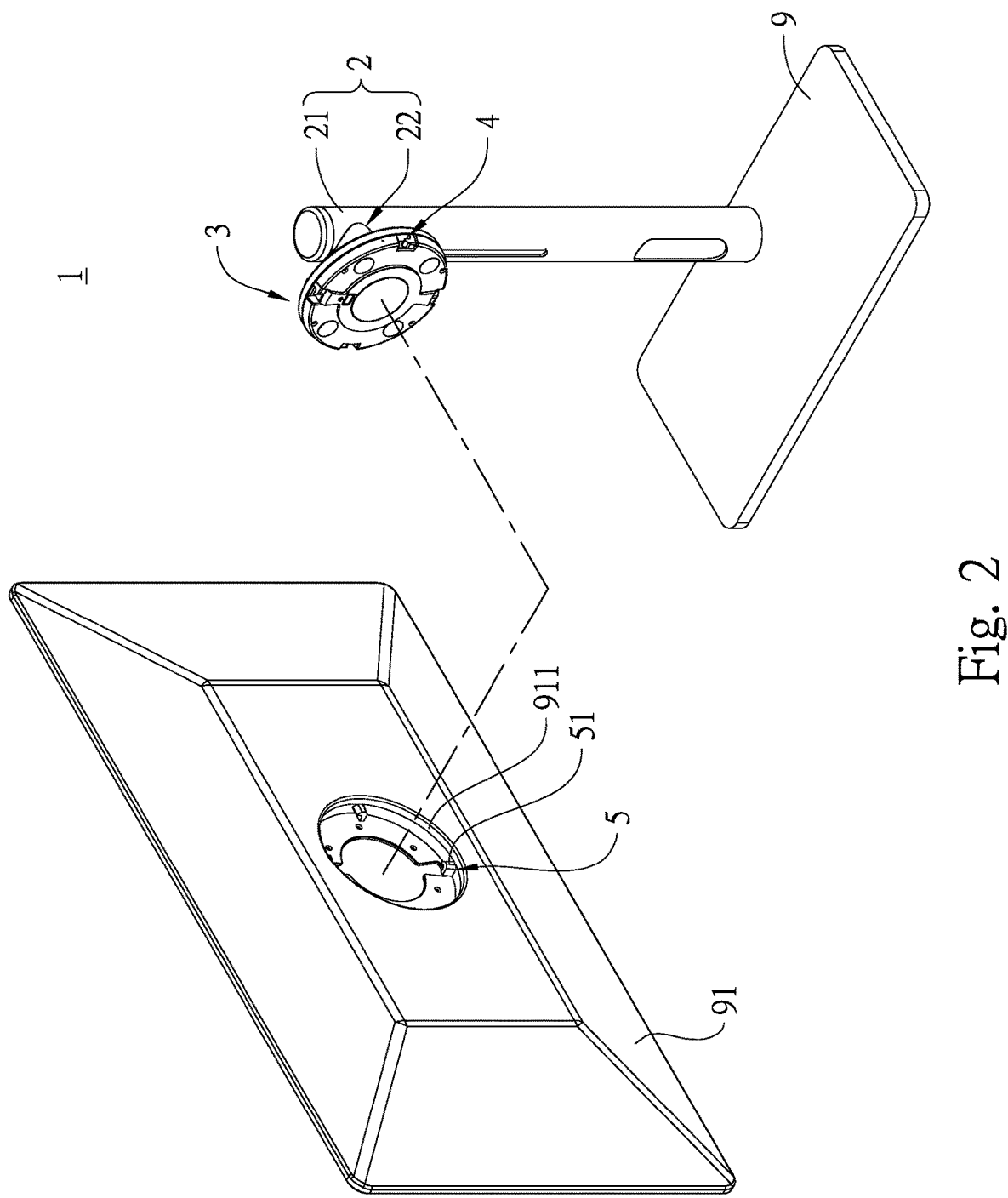
FIG. 2 is a schematic perspective view of a preferred embodiment of the present invention when disassembled with screen.
Figure 3:
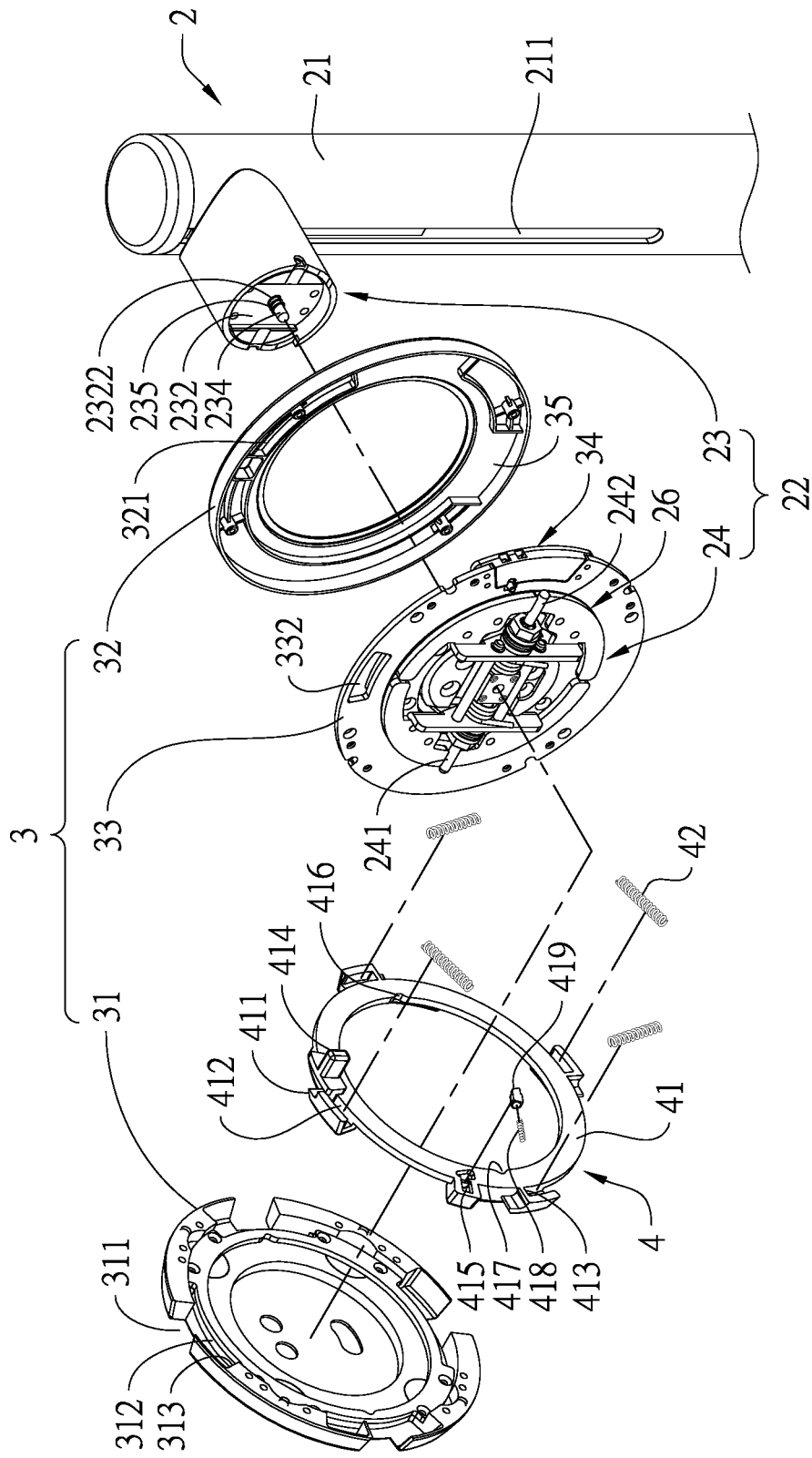
FIG. 3 is an exploded view of components of top base and stand of the present invention.
Figure 4:
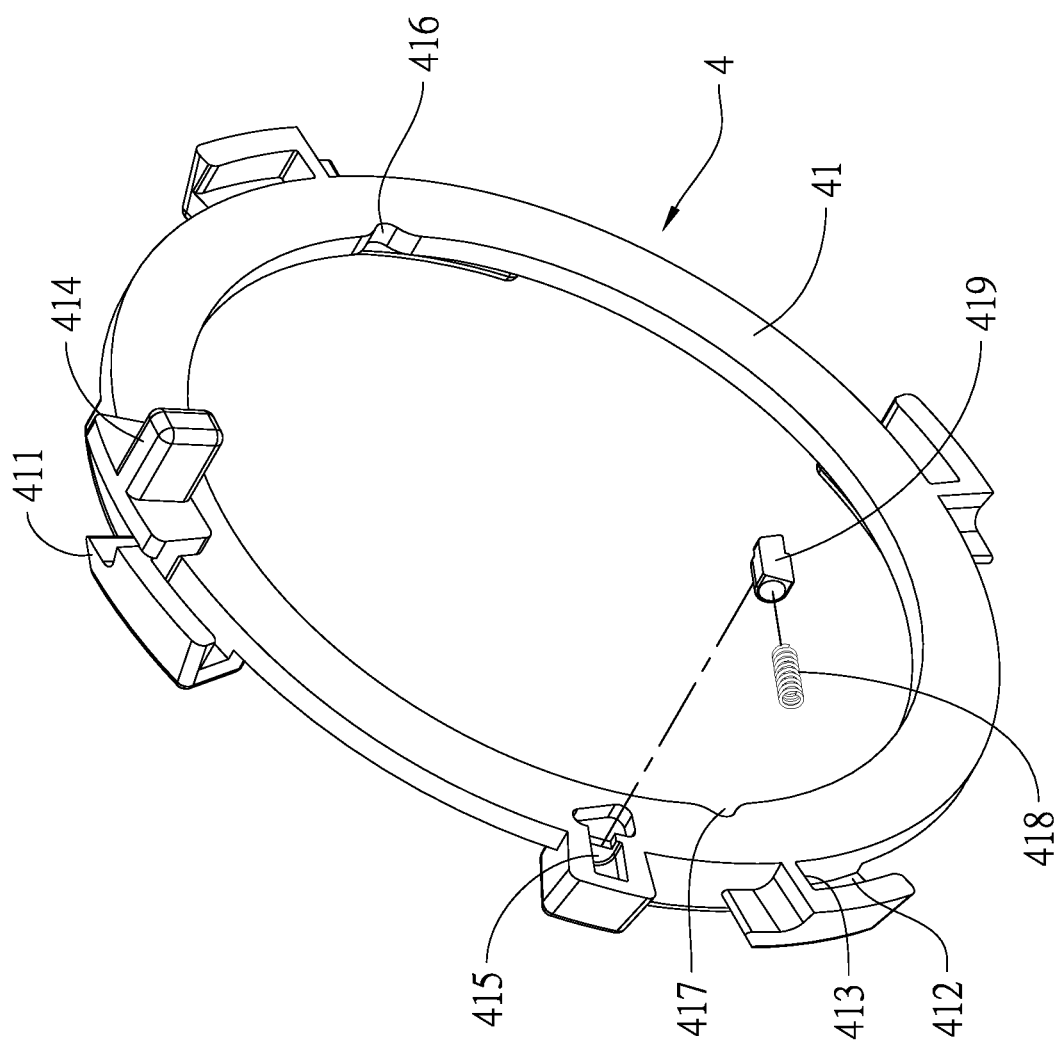
FIG. 4 is a schematic perspective view of first buckling ring of the present invention.
Figure 5:
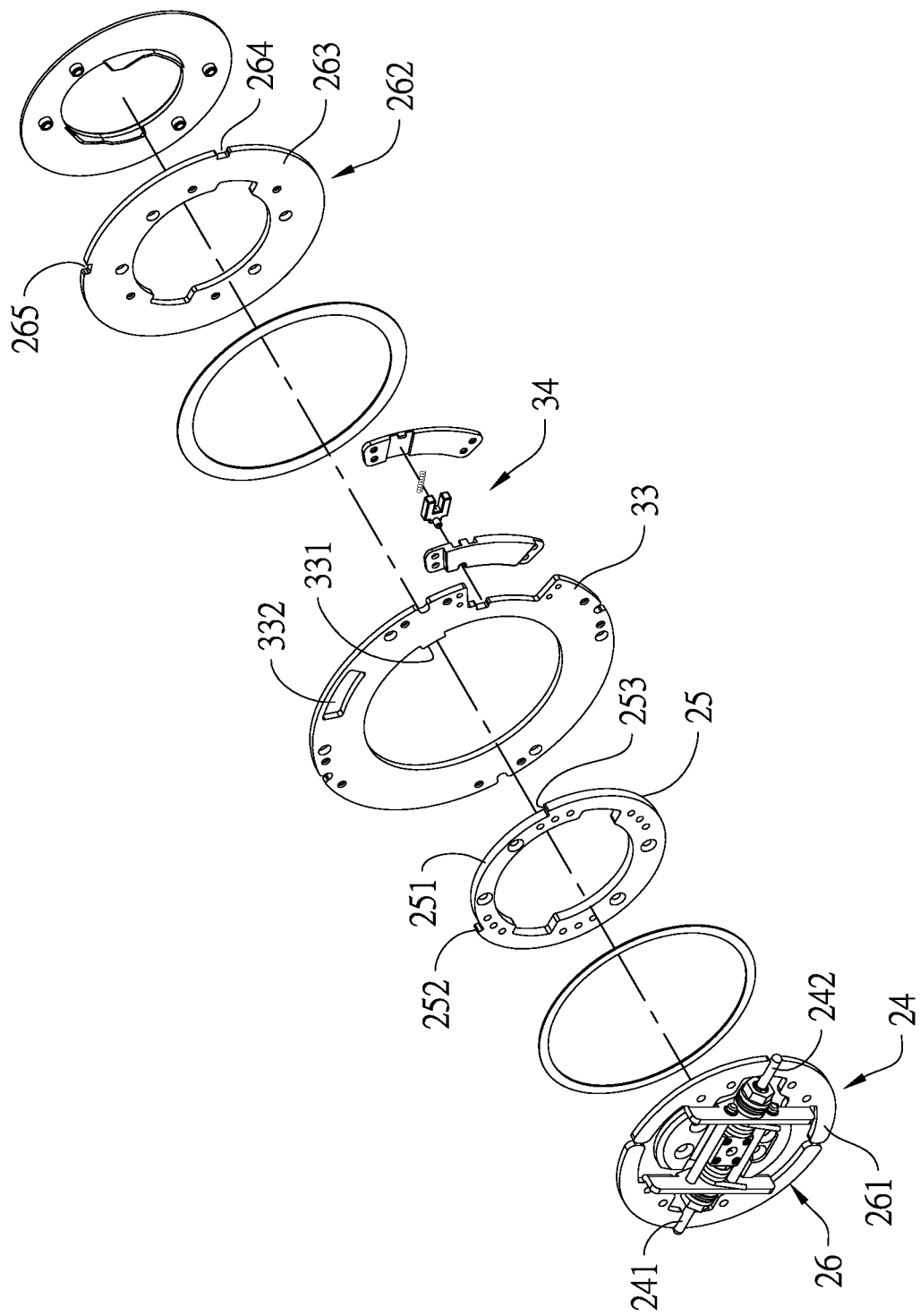
FIG. 5 is an exploded view of partial components of a preferred embodiment of the present invention.
Figure 6:
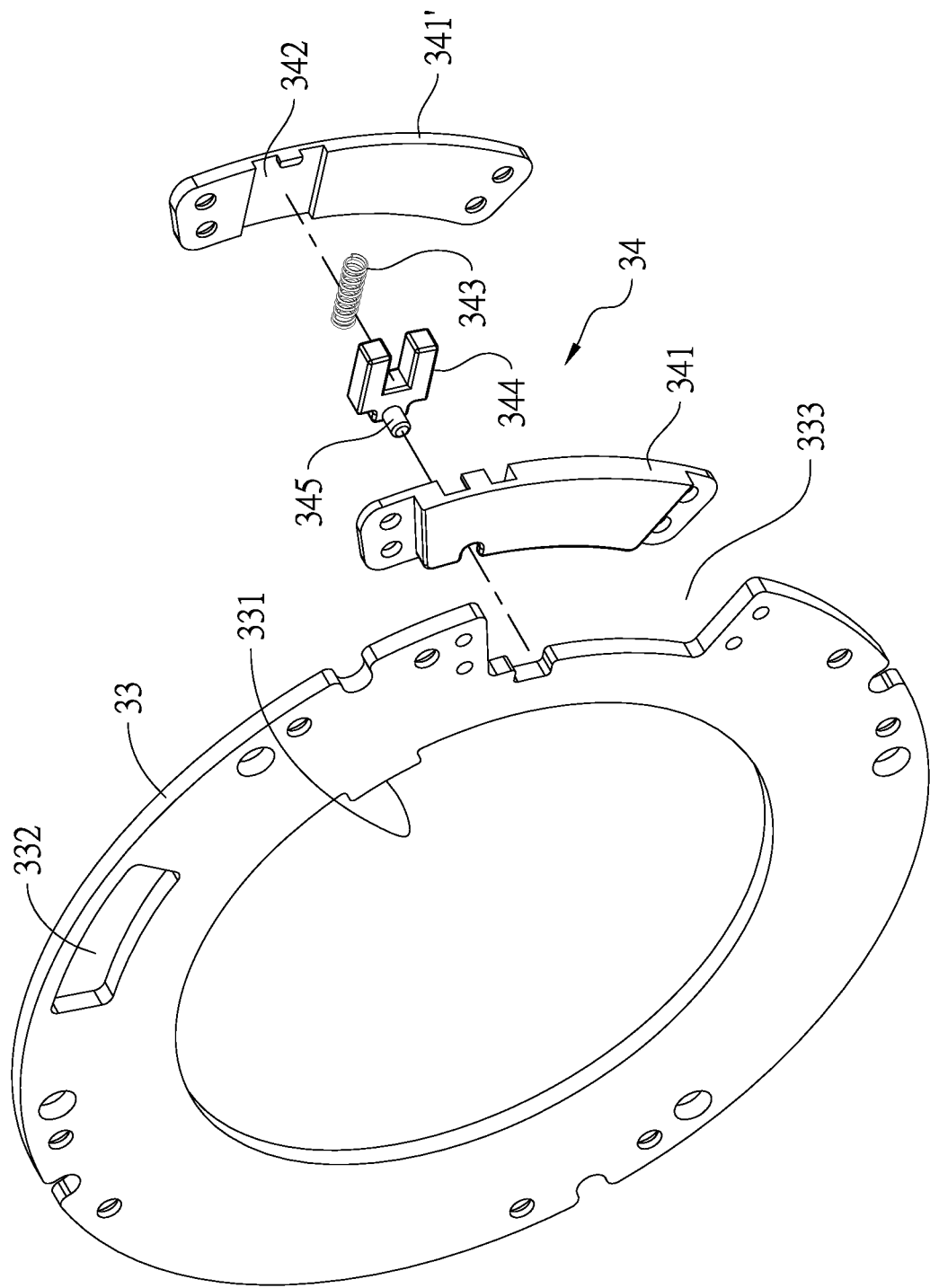
FIG. 6 is an exploded view of components of positioning assembly and linking member of the present invention.
Figure 7:
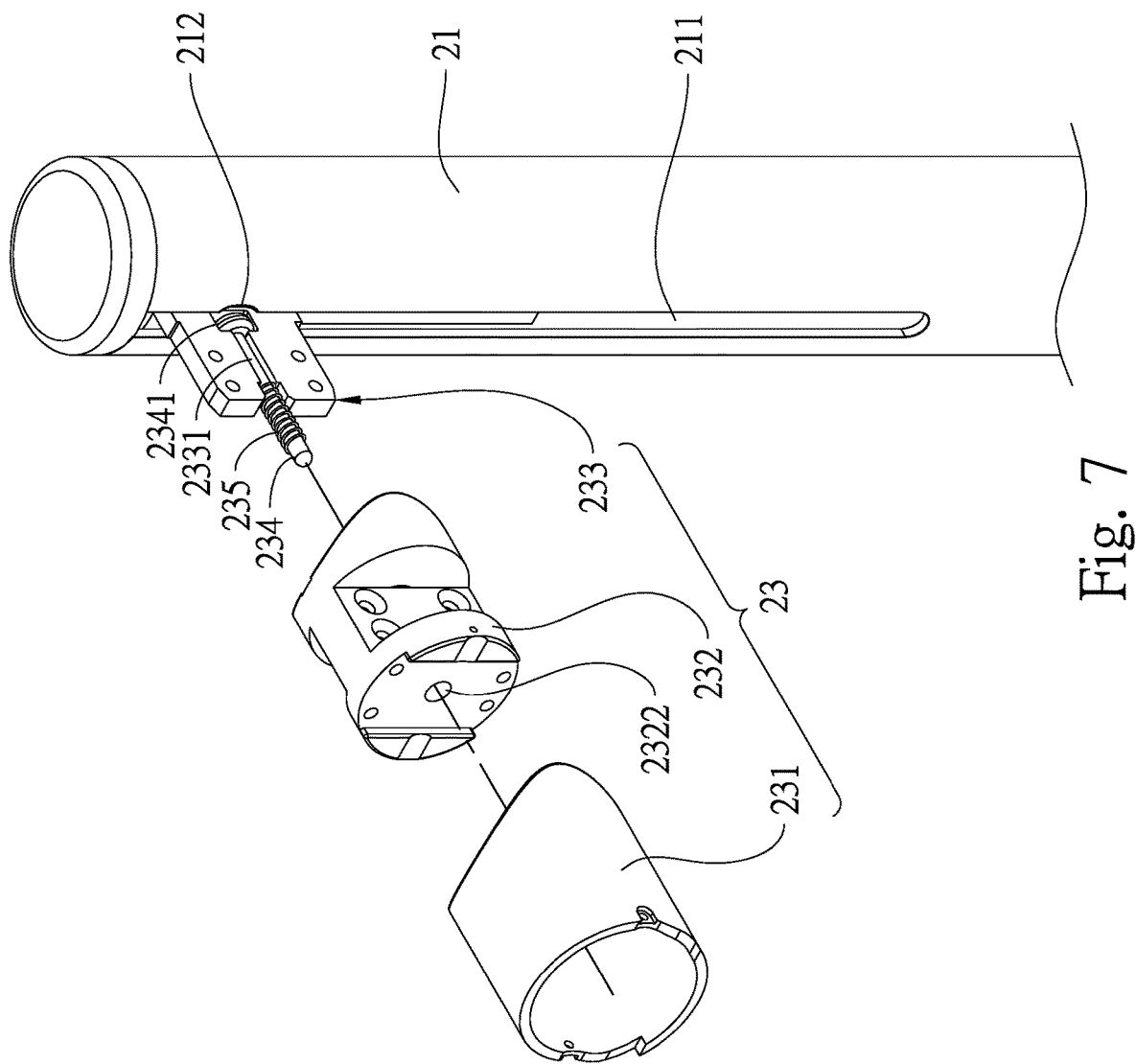
FIG. 7 is an exploded view of components of adapter assembly and supporting frame of the present invention.
Figure 9:
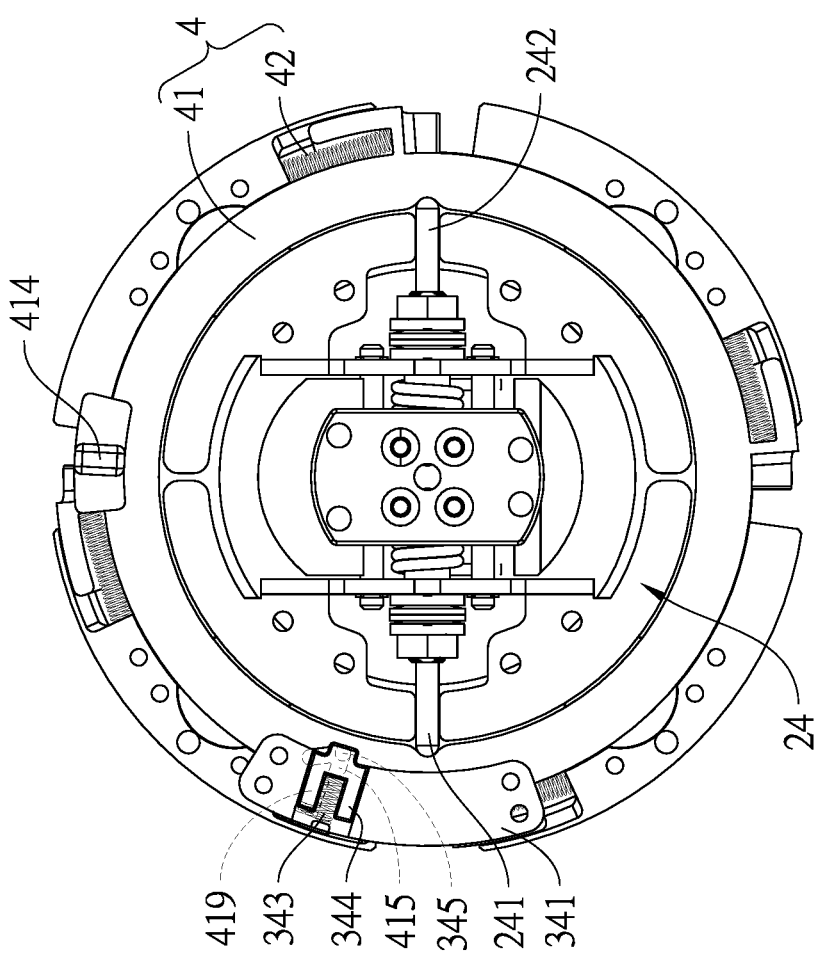
FIG. 9 is a schematic view of screen of the present invention in a state of use when being in a horizontal position.
Figure 8:
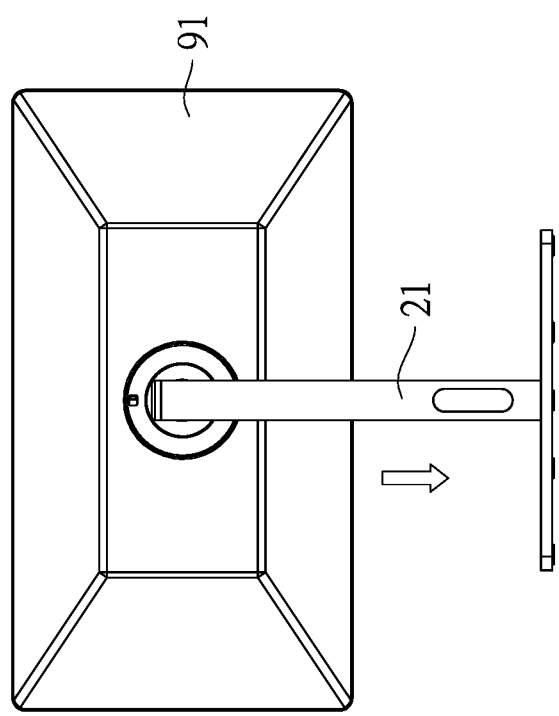
FIG. 8 is a rear side view of screen of the present invention when being in a horizontal position.
Figure 11:
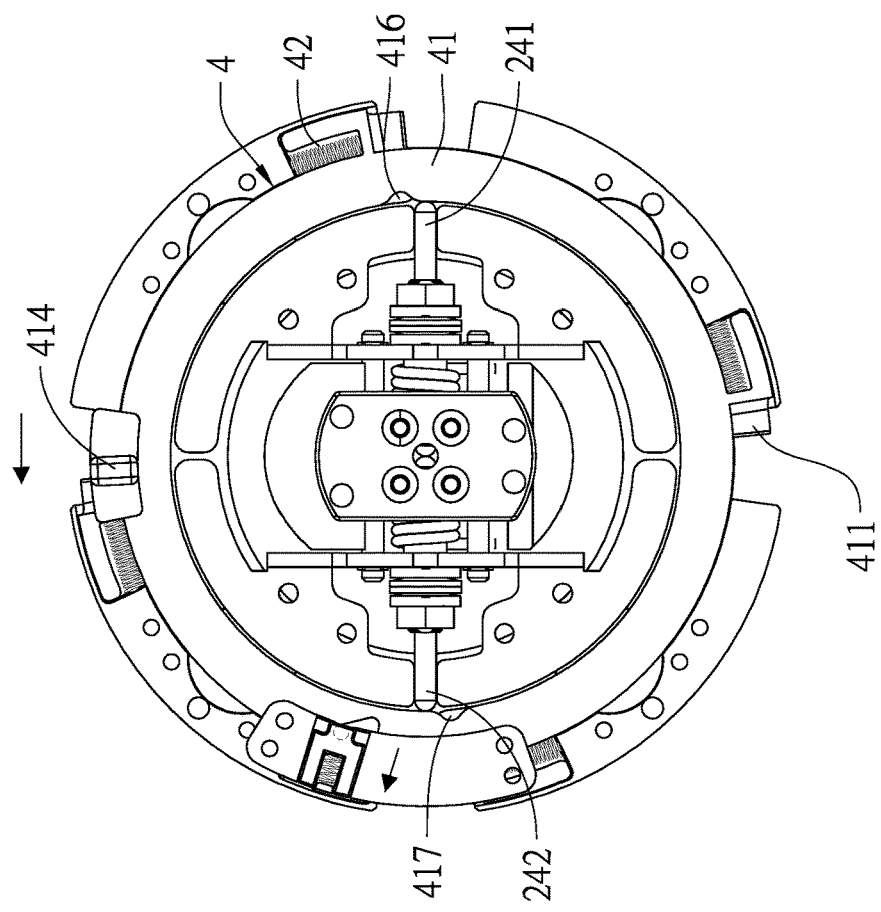
FIG. 11 is a schematic view of pushed portion of the present invention in a state of use when being toggled to the end.
Figure 10:
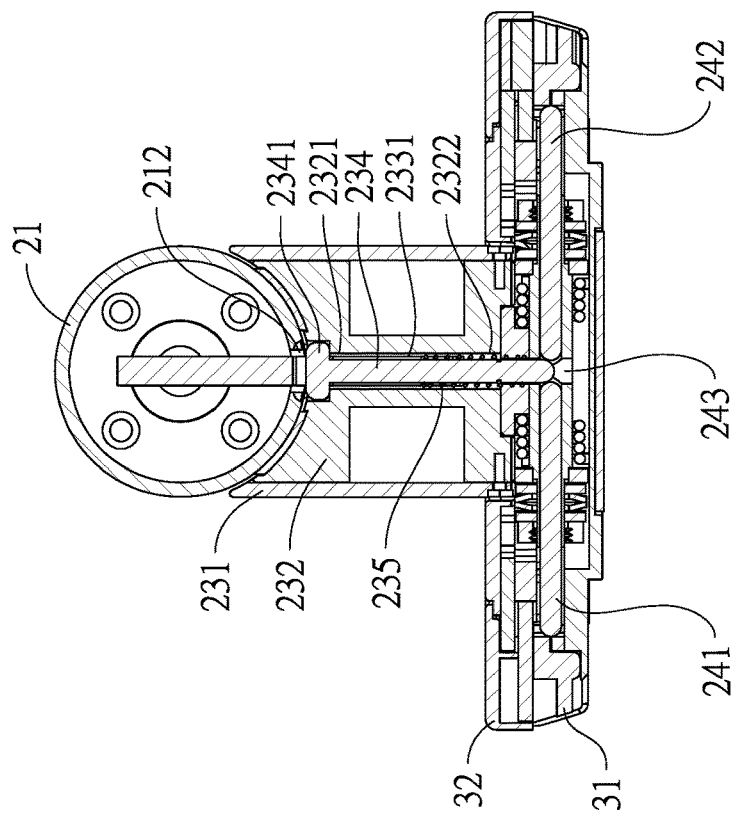
FIG. 10 is a top cross-sectional schematic view of the present invention.
Figure 13:
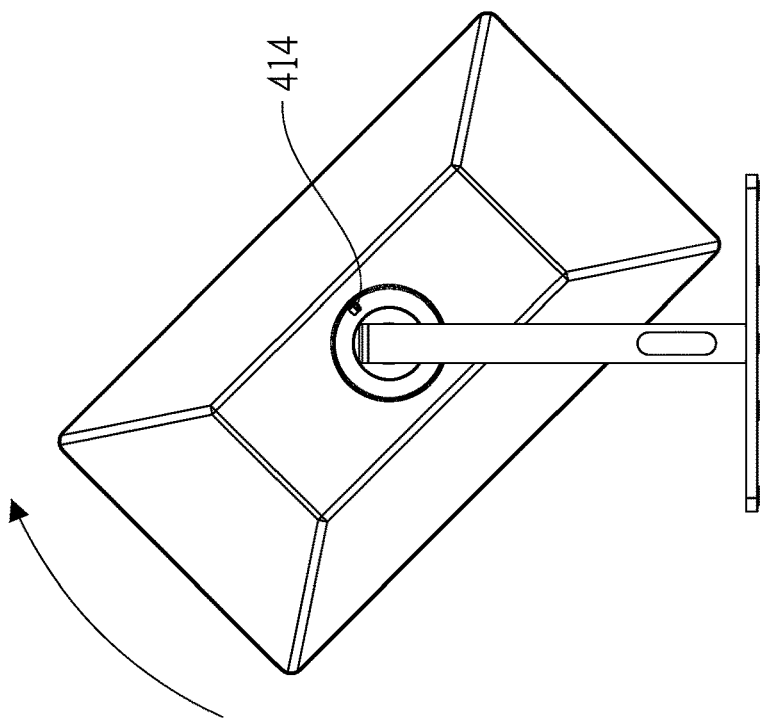
FIG. 13 is a rear schematic view of screen of the present invention when being rotated.
Figure 12:
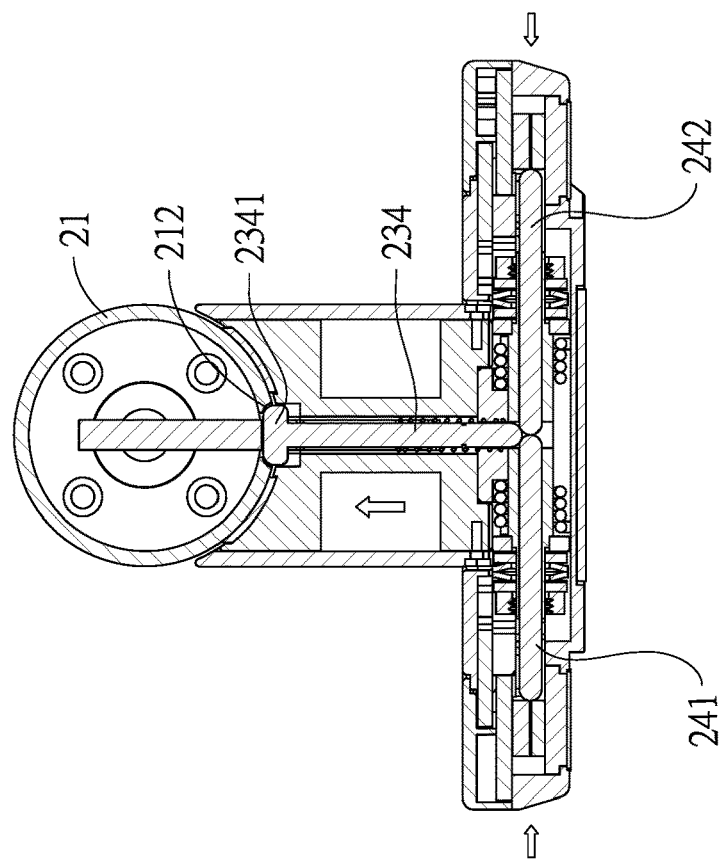
FIG. 12 is a schematic view of the positioning pin of the present invention in a state of use when being pressed against positioning groove.
Figure 15:
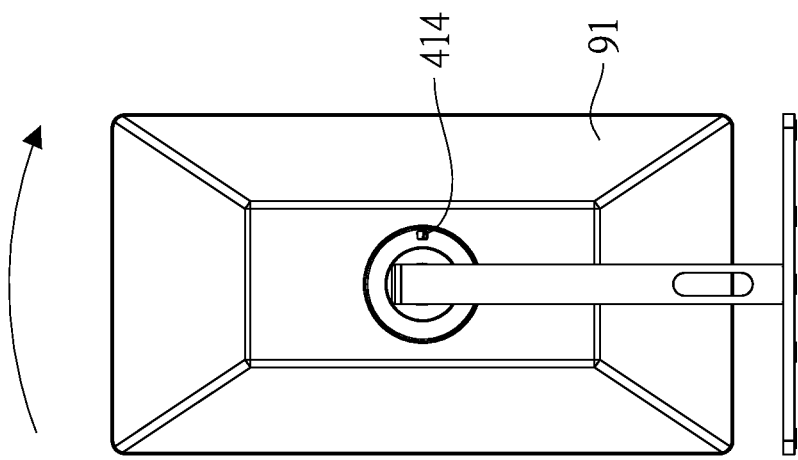
FIG. 15 is a rear schematic view of screen of the present invention when in a vertical position.
Figure 14:
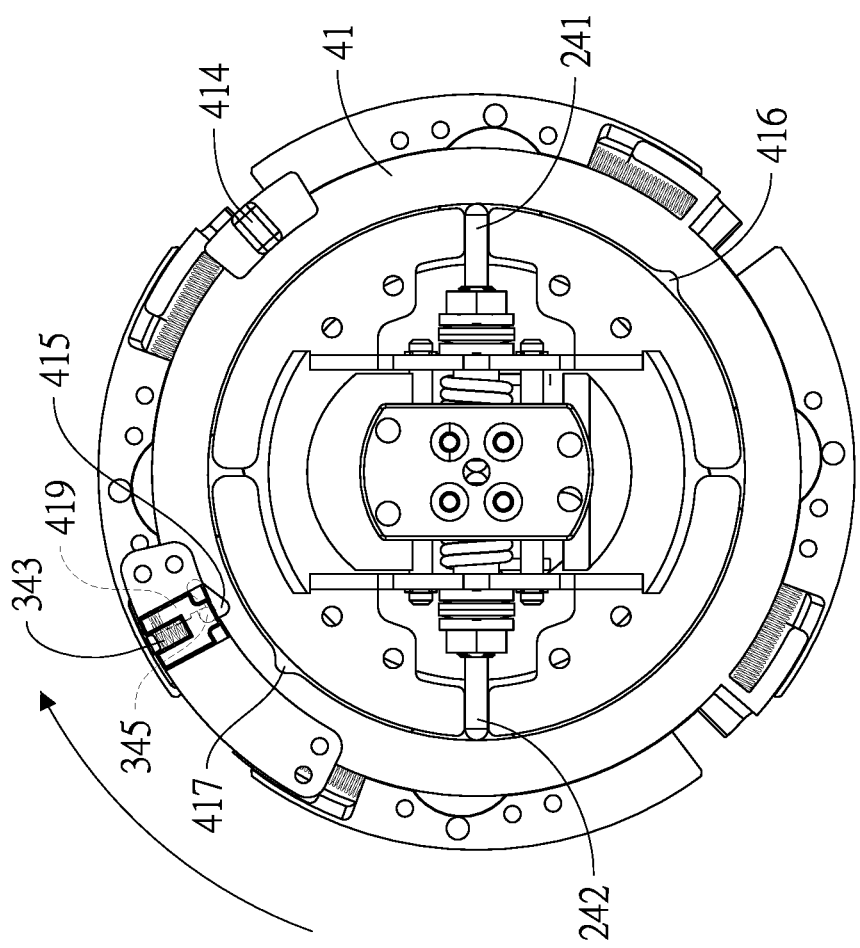
FIG. 14 is a schematic view of screen of the present invention in a state of use when being rotated.
Figure 17:
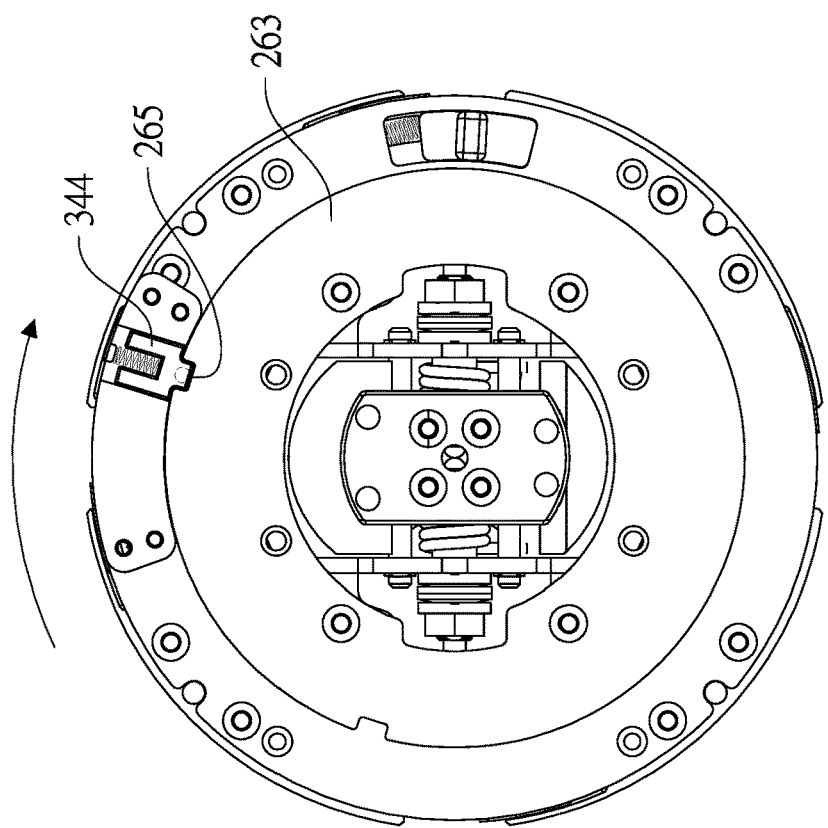
FIG. 17 is a schematic view of screen of the present invention in a state of use when in a vertical position.
Figure 16:
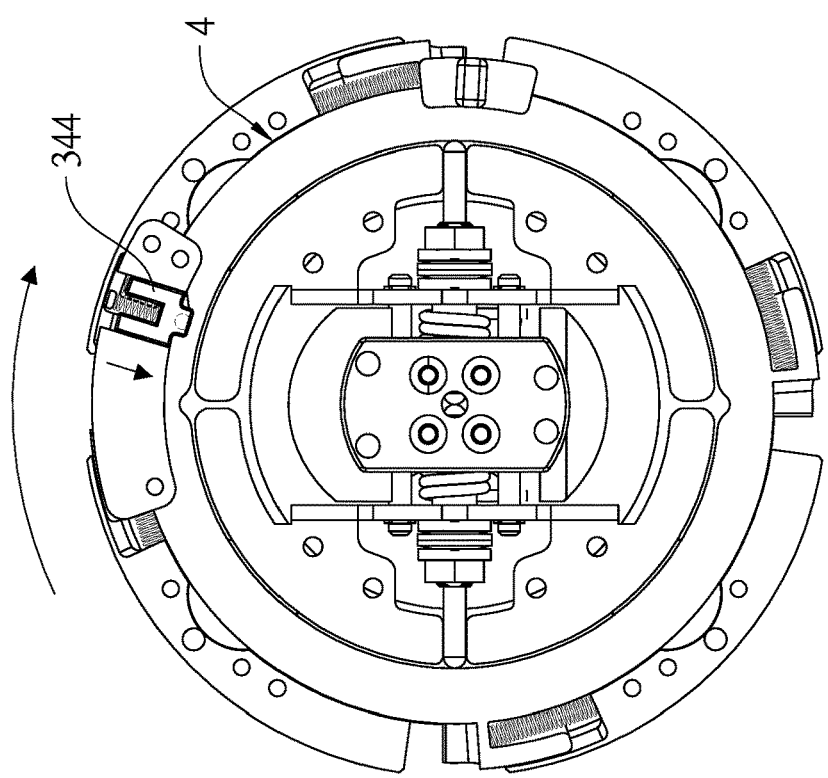
FIG. 16 is a schematic view of screen of the present invention in a state of use when in a vertical position.

Please refer to FIGS. 1 and 2. A stand 2 of a screen rotation quick release structure 1 of the present invention comprises a support frame 21 and an adapter assembly 22. One end of the adapter member 22 is connected to one side of the support frame 21 in a manner capable of moving up and down. The bottom end of the support frame 21 is mounted on a bottom base 9. In implementation, the bottom end of the support frame 21 can be inserted downwards into a stretchable stand or an adjustable support arm, or directly through a fixture for being fixed to a desktop or equipment. A first buckling ring 4 is accommodated and positionally constrained in a clamping space of a top base 3 in a manner capable of restoring position after being rotated. A second buckling ring 5 is fixed on a rear side surface of a screen 91 for being connected to the first buckling ring 4.

As shown in FIGS. 2-10, the preferred embodiment of the screen rotation quick release structure 1 of the present invention mainly comprises a stand 2, a top base 3, a first buckling ring 4 and a second buckling ring 5, wherein the stand 2 comprises a support frame 21 and an adapter assembly 22. The support frame 21 is an upright cylinder. One side of the cylinder has an elongated guiding groove 211. A positioning groove 212 is provided on the upper half of the guiding groove 211. A diameter of the positioning groove 212 is greater than a width of the guiding groove 211. The adapter assembly 22 comprises an adapter member 23, a hinge module 24 and a stopping ring 25.

The adapter member 23 comprises a sleeve 231, a positioning pillar 232 and a lifting plate 233. The positioning pillar 232 is sleeved by the sleeve 231. One end of the positioning pillar 232 locks to the hinge module 24. The other end of the positioning pillar 232 has an flat-shaped engaging groove 2321 and extended coaxially with the positioning pillar 232. A circular through hole 2322 is in communication with the engaging groove 2321 and penetrates through two ends of the positioning pillar 232. The lifting plate 233 is an upright plate. One end of the lifting plate 233 passes through the guiding groove 211 of one side of the support frame 21 and connects to a lifting adjustment mechanism inside the support frame 21 so that the lifting plate 233 can move up and down. The other end of the lifting plate 233 inserts in and engages with the engaging groove 2321 of the positioning pillar 232. And the plate surface of the other end of the lifting plate 233 has a T-shaped horizontal position-constraining groove 2331. A positioning pin 234 having a head portion 2341 is accommodated in the horizontal position-constraining groove 2331. The head portion 2341 of the positioning pin 234 is corresponding to the positioning groove 212 of one side of the support frame 21 and keeps a distance from the positioning groove 212. After one end of the positioning pin 234 passes through a spring 235, the one end of the positioning pin 234 protrudes from one end of the positioning pillar 232 so that the positioning pin 234 is capable of moving back and forth.

The hinge module 24 comprises a connecting assembly 26, a first pivoting shaft 241 and a second pivoting shaft 242. The connecting assembly 26 comprises a fixed plate set 261 and a position-constraining plate set 262. The fixed plate set 261 mainly comprises two symmetrical L-shaped bent plates for being coaxially pivoted to the first pivoting shaft 241 and the second pivoting shaft 242 so that the first pivoting shaft 241 and the second pivoting shaft 242 are on the same horizontal line and so that a gap 243 between proximal ends of the first pivoting shaft 241 and the second pivoting shaft 242 is provided for accommodating one end of the positioning pin 234. By being connected to one end of the positioning pillar 232, the hinge module 24 can use the first pivoting shaft 241 and the second pivoting shaft 242 as the center of rotation to drive the screen 91 to tilt and rotate. The fixed plate set 261 is locked to the position-constraining plate set 262, and the stopping ring 25 is clamped and connected between the fixed plate set 261 and the position-constraining plate set 262. An outer periphery of the stopping ring 25 has a curved groove 251. Two sides of the curved groove 251 form a first stopping portion 252 and a second stopping portion 253 respectively. The position-constraining plate set 262 comprises a position-constraining plate 263. An outer periphery of the annular position-constraining plate 263 has two grooves with a 90 degree angle configuration. The two grooves are respectively used as a first position-constraining portion 264 and a second position-constraining portion 265.

The top base 3 comprises a front covering body 31, a rear covering body 32, a linking member 33, and a positioning assembly 34, wherein the front covering body 31 and the rear covering body 32 are relatively covering each other, and a clamping space 35 is formed between the front covering body 31 and the rear covering body 32 for accommodating and positionally constraining the hinge module 24. The front covering body 31 is disk-shaped. An outer periphery of the front covering body 31 has a plurality of first notches 311 arranged in a circular array. The plurality of first notches 311 is in communication with the clamping space 35. A plurality of second curved grooves 312 is arranged in a circular array on one side of the front covering body 31 for accommodating and positioning a part of a plurality of third elastic members 42 in it. One end of each of the plurality of second curved grooves 312 forms a fourth position-constraining portion 313 for positionally constraining one end of one of a plurality of third elastic members 42 respectively. A curved through hole is arranged on one side of the rear covering body 32. The curved through hole is used as a first position-constraining hole 321. The first position-constraining hole 321 is in communication with the clamping space 35.

The linking member 33 is a ring plate. The linking member 33 is clamped and locked between the front covering body 31 and the rear covering body 32. And the stopping ring 25 is sleeved by the linking member 33, so that the linking member 33 is clamped between the fixed plate set 261 and the position-constraining plate set 262 in a rotatable manner. An inner ring surface of the linking member 33 has a radially protruding pressed-against portion 331. The pressed-against portion 331 is positionally constrained in the curved groove 251 on the outer periphery of the stopping ring 25, so that, after the linking member 33 being rotated, the two sides of the pressed-against portion 331 are pressed against the first stopping portion 252 or the second stopping portion 253 respectively. Moreover, the plate surface of the linking member 33 has a second position-constraining hole 332. An outer periphery of the linking member 33 has a curved second notch 333.

The positioning assembly 34 comprises a pair of clamping pieces (341, 341'), a first elastic member 343, and a positioning member 344, wherein the pair of clamping pieces (341, 341') is positioned in the curved second notch 333 of the outer periphery of the linking member 33, and two ends of the pair of clamping pieces (341, 341') are connected to the linking member 33 respectively. A positioning space 342 is arranged between the pair of clamping pieces (341, 341') for positioning a spring and the positioning member 344. The spring is used as the first elastic member 343. The first elastic member 343 is positionally constrained in a notch of the positioning member 344. And one end of the first elastic member 343 is pressed against the positioning member 344, so that the positioning member 344 is capable of radially moving back and forth relative to the linking member 33. Moreover, the positioning member 344 further has a guiding rod 345 extending laterally. The guiding rod 345 penetrates outwards through a notch on one side of the pair of clamping pieces (341, 341').

The first buckling ring 4 is accommodated and positionally constrained in the clamping space 35 between the front covering body 31 and the rear covering body 32. The first buckling ring 4 comprises an annular buckling plate 41 and a plurality of third elastic members 42. An outer ring surface of the annular buckling plate 41 has a plurality of wedge-shaped blocks arranged in a circular array and protruding forwards. The wedge-shaped blocks are used as first buckling portions 411. A plurality of curved guide blocks is arranged in a circular array on one side of the annular buckling plate 41 for corresponding guiding into a plurality of second curved grooves 312 to form a stable guiding effect, and such that the plurality of first buckling portions 411 displaces back and forth respectively in the plurality of first notches 311 in a manner capable of moving. Moreover, the plurality of curved guide blocks is respectively recessed with a first curved groove 412 for accommodating and positioning the other part of the plurality of elastic members 42 in it. A third position-constraining portion 413 is formed respectively on one end of the first curved groove 412 where respectively corresponding to the plurality of curved guide blocks for positionally constraining the other end of the plurality of third elastic members 42 respectively.

A pushed portion 414 and a receiving groove 415 are arranged on the other side of the annular buckling plate 41. The pushed portion 414 passes through the second position-constraining hole 332 of the linking member 33 and the first position-constraining hole 321 of the rear covering body 32 in sequence, and protrudes from the top base 3. By pushing and pressing the pushed portion 414, the first buckling ring 4 is capable of being reset after being rotated, and the plurality of first buckling portions 411 are respectively hidden in the plurality of first notches 311 of the front covering body 31 to form protection. An inner ring surface of the annular buckling plate 41 has a first engaging groove 416 and a second engaging groove 417 with openings opposite to each other. The first engaging groove 416 and the second engaging groove 417 are respectively corresponding to the distal ends of the first pivoting shaft 241 and the second pivoting shaft 242.

A compressed spring and a pressed-against member 419 are respectively accommodated and positionally constrained in the receiving groove 415 on the other side of the annular buckling plate 41. The compressed spring is used as a second elastic member 418. One end of the pressed-against member 419 is pressed against the second elastic member 418, the other end of the pressed-against member 419 is pressed against the guiding rod 345 of the positioning member 344 for constraining the movement of the guiding rod 345 in the receiving groove 415.

The second buckling ring 5 is a circular collar. The second buckling ring 5 is accommodated in and connected to a circular groove 911 on the rear side surface of a screen 91. An inner ring surface of the second buckling ring 5 has a plurality of wedge-shaped blocks arranged in a circular array and protruding backwards. The wedge-shaped blocks are used as second buckling portions 51. The plurality of second buckling portions 51 are respectively inserted into the plurality of first notches 311 of the front covering body 31, and the plurality of second buckling portions 51 are correspondingly buckled to the plurality of first buckling portions 411 on the outer ring surface of the annular buckling plate 41 respectively so that the second buckling ring 5 is connected to or separated from the first buckling ring 4.

Thereby, when the screen 91 is in a horizontal position, the screen 91 is capable of being positioned up and down. As shown in FIGS. 2, 3, 11 and 12, when the screen 91 is positioned horizontally above one side of the support frame 21, the user pushes and presses the pushed portion 414 to toggle the annular buckling plate 41 of the first buckling ring 4, then the plurality of third elastic members 42 can be formed into a compressed energy storage state, so that the first engaging groove 416 and the second engaging groove 417 of the annular buckling plate 41 are staggered from the distal ends of the first pivoting shaft 241 and the second pivoting shaft 242 respectively, so that the proximal ends of the first pivoting shaft 241 and the second pivoting shaft 242 simultaneously push and press one end of the positioning pin 234. And when the positioning pin 234 moves such that the head portion 2341 correspondingly is pressed against the positioning groove 212 of one side of the support frame 21, the screen 91 cannot be adjusted up or down to be positioned at a fixed height. At this time, if the user pushes and presses the pushed portion 414 to the end, the buckling effect of the plurality of second buckling portions 51 and the plurality of first buckling portions 411 can be completely released, so that the screen 91 can be separated from the first buckling ring 4 after being pulled.

Also shown in FIGS. 5, 6, 13~17, when the user slightly pushes and presses the pushed portion 414, so that the first engaging groove 416 and the second engaging groove 417 of the annular buckling plate 41 are staggered from the distal ends of the first pivoting shaft 241 and the second pivoting shaft 242 respectively, it can also make the screen 91 unable to be adjusted up or down to be positioned at a fixed height being rotated. However, due to the sloping sidewall of the receiving groove 415 of the annular buckling plate 41 pushing the guiding rod 345, the positioning member 344 will move radially away from the axis of the linking member 33, so that one end of the positioning member 344 is separated from the constrain of the first position-constraining portion 264 of the annular position-constraining plate 263, and one end of the pressed-against member 419 is pressed against the guiding rod 345, so that when the user is turning the screen 91, the user cannot continue to push and press the pushed portion 414 to prevent the screen 91 from being separated from the first buckling ring 4.

When the user pushes the screen 91 such that the linking member 33 being rotated synchronously with the first buckling ring 4 and the front covering body 31 and the rear covering body 32 of the top base 3, then through being pressed against the second stopping portion 253 of the stopping ring 25 via one side of the pressed-against portion 331 of the linking member 33, so that the screen 91 will not being rotated excessively; while since the positioning member 344 reaches the position of the second position-constraining portion 265 of the annular position-constraining plate 263, one end of the positioning member 344 will move radially in the direction close to the axis of the position-constraining plate 263 to engage with the second position-constraining portion 265, so that the screen 91 is positioned in the vertical position.

Based on the above structure, the user can choose to rotate the screen or remove the screen only when the screen of the present invention is positioned at a fixed height. Therefore, not only can the screen be prevented from being damaged when being rotated, but it can also be easily reassembled after the screen is disassembled. Furthermore, during the screen being rotated, since "the pushed portion" cannot be toggled and the screen cannot be moved up or down, it can effectively prevent the user from falling the screen due to accidental touch and the screen cannot be removed to ensure the safety of the product and use. In addition, in terms of rotational positioning, the present invention replaces the traditional positioning structure with "two stopping portions", and uses the "two position-constraining portions" to respectively engage the positioning member, so that when the screen rotates vertically or horizontally, a stop can be formed to avoid tilting or excessive rotation. The "first buckling portion" is accommodated in "the covering body of the top base of the stand" to avoid "the first buckling portion" and "the second buckling portion" from being too obtrusive, so as to prevent damage or injury to the user due to being hit.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A screen rotation quick release structure, comprising: a stand comprising a support frame and an adapter assembly, where a positioning groove is provided on an upper portion of one side of said support frame; said adapter assembly comprises an adapter member and a hinge module, one end of said adapter member is connected to said support frame in a manner capable of moving up and down; one end of a positioning pin protrudes from the other end of said adapter member, and said positioning pin is coaxially positioned inside said adapter member in a manner capable of moving back and forth so that the other end of said positioning pin is pressed against and positionally constrained in said positioning groove; one side of said hinge module is connected to said the other end of said adapter member, and said hinge module comprises a first pivoting shaft and a second pivoting shaft on the same horizontal line, a gap between proximal ends of said first pivoting shaft and said second pivoting shaft is provided for accommodating said one end of said positioning pin;

a top base comprising a clamping space, where said hinge module is accommodated and positionally constrained in said clamping space; one side of said top base has a first position-constraining hole, said first position-constraining hole is in communication with said clamping space; and a first buckling ring accommodated and positionally constrained in said clamping space in a manner capable of restoring position after being rotated, one side of said first buckling ring has a pushed portion, said pushed portion passes through said first position-constraining hole and protrudes from said one side of said top base so as to push and press said first buckling ring to rotate; an inner ring surface of said first buckling ring has a first engaging groove and a second engaging groove, said first engaging groove and said second engaging groove are respectively corresponding to distal ends of said first pivoting shaft and said second pivoting shaft.

2. The screen rotation quick release structure according to claim 1, wherein said top base comprises a front covering body and a rear covering body, said front covering body and said rear covering body are relatively covering each other, said clamping space is formed between said front covering body and said rear covering body, said first position-constraining hole is provided on one side of said rear covering body, an outer periphery of said front covering body has a plurality of first notches, said plurality of first notches is in communication with said clamping space.

3. The screen rotation quick release structure according to claim 2, further comprising a second buckling ring, said second buckling ring is connected to a rear side surface of a screen, said second buckling ring has a plurality of second buckling portions for being inserted into said plurality of first notches of said front covering body respectively and correspondingly buckled with a plurality of first buckling portions on the other side of said first buckling ring respectively.

4. The screen rotation quick release structure according to claim 2, wherein said adapter assembly further comprises a stopping ring, an outer periphery of said stopping ring has a first stopping portion and a second stopping portion; said top base further comprises a linking member, said linking member is clamped and connected between said front covering body and said rear covering body, an inner periphery of said linking member has a pressed-against portion for being pressed against said first stopping portion or said second stopping portion respectively, so that said screen is positioned in vertical or horizontal position, after said linking member being rotated synchronously with said top base and said screen.

5. The screen rotation quick release structure according to claim 4, wherein said hinge module further comprises a connecting assembly, said connecting assembly comprises a fixed plate set and a position-constraining plate set, said fixed plate set coaxially is pivoted to said first pivoting shaft and said second pivoting shaft, said stopping ring is clamped and connected with said fixed plate set and said position-constraining plate set, and said linking member is clamped between said fixed plate set and said position-constraining plate set in a rotatable manner.

6. The screen rotation quick release structure according to claim 2, wherein said first buckling ring comprises an annular buckling plate and a plurality of third elastic members, said annular buckling plate has a plurality of third position-constraining portions arranged in a circular array for positionally constraining one end of said plurality of third elastic members respectively, one side of said front covering body has a plurality of fourth position-constraining portions for positionally constraining the other end of said plurality of third elastic members respectively.

7. The screen rotation quick release structure according to claim 6, wherein one side of said annular buckling plate has a plurality of first curved grooves arranged in a circular array, one end of each of said first curved grooves forms one corresponding third position-constraining portion, said one side of said front covering body has a plurality of second curved grooves arranged in a circular array, one end of each of said second curved grooves forms one corresponding fourth position-constraining portion.

8. The screen rotation quick release structure according to claim 1, wherein said one side of said support frame has a guiding groove, said positioning groove is disposed at an upper portion of said guiding groove; said one end of said adapter member of said adapter assembly passes through said guiding groove to be connected to said support frame in a manner capable of moving up and down.

9. The screen rotation quick release structure according to claim 8, wherein said adapter member comprises a sleeve, a positioning pillar, and a lifting plate, said positioning pillar is sleeved by said sleeve, one end of said positioning pillar is connected to said hinge module, the other end of said positioning pillar has an engaging groove for being engaged with said lifting plate, said engaging groove is in communication with a through hole for said one end of said positioning pin protruding outwards; one end of said lifting plate passes through said guiding groove, and a plate surface of the other end of said lifting plate has a horizontal position-constraining groove for positioning said positioning pin capable of moving back and forth, so that said the other end of said positioning pin is pressed against said guiding groove or positionally constrained in said positioning groove.

10. The screen rotation quick release structure according to claim 9, wherein said one end of said positioning pin passes through a spring so that said positioning pin is capable of moving back and forth; said horizontal position-constraining groove of said the other end of said lifting plate is T-shaped, and said the other end of said positioning pin has a head portion for being positioned in said horizontal position-constraining groove.

11. The screen rotation quick release structure according to claim 1, wherein said top base further comprises a linking member, an outer periphery of said linking member has a positioning assembly, said positioning assembly has a positioning member capable of radially moving back and forth; said hinge module further comprises a connecting assembly, said connecting assembly comprises a fixed plate set and a position-constraining plate set, said fixed plate set coaxially is pivoted to said first pivoting shaft and said second pivoting shaft, said linking member is clamped between said fixed plate set and said position-constraining plate set in a rotatable manner; said position-constraining plate set comprises a position-constraining plate, an outer periphery of said position-constraining plate has a first position-constraining portion and a second position-constraining portion for being engaged with said positioning member, after said linking member being rotated.

12. The screen rotation quick release structure according to claim 11, wherein said outer periphery of said linking member has a second notch, said positioning assembly further comprises a first elastic member and a pair of clamping pieces, one end of said first elastic member is pressed against said positioning member; said pair of clamping pieces is positioned in said second notch, and two ends of said pair of clamping pieces are connected to said linking member respectively, a positioning space is arranged between said pair of clamping pieces for positioning said first elastic member and said positioning member, so that said positioning member is capable of radially moving back and forth.

13. The screen rotation quick release structure according to claim 12, wherein said positioning member further comprises a guiding rod, said guiding rod penetrates outwards through said one side of said pair of clamping pieces; said one side of said first buckling ring has a receiving groove for accommodating and positionally constraining a second elastic member and a pressed-against member, one end of said pressed-against member is pressed against said second elastic member, the other end of said pressed-against member is pressed against said guiding rod for constraining movement of said guiding rod.

* * * * *